United States Patent
Enomoto et al.

(10) Patent No.: US 7,383,527 B2
(45) Date of Patent: Jun. 3, 2008

(54) SEMICONDUCTOR INTEGRATED CIRCUIT MANUFACTURING METHOD AND SEMICONDUCTOR INTEGRATED CIRCUIT MANUFACTURING APPARATUS

(75) Inventors: Kenji Enomoto, Nagaokakyo (JP); Tadayuki Kawai, Sagamihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 200 days.

(21) Appl. No.: 11/215,998

(22) Filed: Sep. 1, 2005

(65) Prior Publication Data

US 2006/0080628 A1 Apr. 13, 2006

(30) Foreign Application Priority Data

Sep. 27, 2004 (JP) ............................. 2004-280517

(51) Int. Cl.
*G06F 17/50* (2006.01)
(52) U.S. Cl. .......................................... 716/12; 716/13
(58) Field of Classification Search ............. 716/12–16
See application file for complete search history.

(56) References Cited

U.S. PATENT DOCUMENTS

| | | | |
|---|---|---|---|
| 6,099,581 A | 8/2000 | Sakai | |
| 6,701,506 B1 * | 3/2004 | Srinivasan et al. | ............ 716/10 |
| 6,772,404 B2 | 8/2004 | Tanaka | |
| 7,093,208 B2 * | 8/2006 | Williams et al. | ................ 716/3 |
| 7,137,097 B1 * | 11/2006 | Aji et al. | ...................... 716/12 |
| 2004/0243964 A1 * | 12/2004 | McElvain et al. | ............ 716/12 |

FOREIGN PATENT DOCUMENTS

| | | |
|---|---|---|
| JP | 10-092938 | 4/1998 |
| JP | 2002-093912 | 3/2002 |
| JP | 2003-085224 | 3/2003 |
| JP | 2004-178285 | 6/2004 |
| WO | 00/50767 | 7/1999 |
| WO | 99/50767 | 7/1999 |

OTHER PUBLICATIONS

English Language Abstract of JP 2003-085224.
English Language Abstract of JP 2002-093912.
English Language Abstract of JP 2004-178285.
English Language Abstract of JP 10-092938.
U.S. Appl. No. 11/202,863 to Shimura, filed Aug. 19, 2005.

* cited by examiner

*Primary Examiner*—Jack Chiang
*Assistant Examiner*—Binh C Tat
(74) *Attorney, Agent, or Firm*—Greenblum & Bernstein, P.L.C.

(57) ABSTRACT

A semiconductor integrated circuit manufacturing method and semiconductor integrated circuit manufacturing apparatus are provided that implement automatic placement that reflects constraints provided regarding parasitic elements and inter-element variation provided in a real-valued range. A netlist is prepared in advance, a permissible range setting process sets a permissible range relating to elements, a floor plan process creates a floor plan that satisfies the set permissible range using the netlist, an automatic placement process places elements using the created floor plan and extracts routing constraints that realize a permissible range for parasitic elements, and a routing process performs routing in accordance with the extracted routing constraints.

20 Claims, 15 Drawing Sheets

SEMICONDUCTOR INTEGRATED CIRCUIT MANUFACTURING METHOD AND SEMICONDUCTOR INTEGRATED CIRCUIT MANUFACTURING APPARATUS

BACKGROUND OF THE INVENTION

1. Field of the Invention

The present invention relates to a semiconductor integrated circuit (LEI: Large Scale Integration, hereinafter referred to as "LEI") manufacturing method, and more particularly to a technology effective in the suppression of parasitic elements occurring between elements and wiring in analog layout design, suppression of variation occurring between elements, and element placement area optimization.

2. Description of the Related Art

Recently, together with advances in LEI manufacturing technology, progress has been made in achieving larger scale, higher speed, and greater precision. Together with this, with regard to wiring (routing), the influence of wiring length, wiring width, inter-wiring distance, inter-layer contacts, substrate-relative and such-like parasitic elements, process variation (film thickness, lithographic etching, etc.), and so forth, has become conspicuous. With regard to elements, also, the effects of process variation (film thickness, ion injection density, lithographic etching, length, width, area, etc.) And so forth have become marked. These have become major problems as they are linked to degradation of LEI performance and quality. With conventional technology, automatic prediction and extraction has been performed of design constraints such as element pairing and grouping from connectional relationships of applicable circuits when performing automatic placement, and automatic placement and routing has been carried out based on these extracted constraints. (See, for example, Unexamined Japanese Patent Publication No. 2003-85224 (page 24, FIG. 1)).

However, constraints provided in this way are set based on experience, and it has not been possible to satisfy characteristics at one time even assuming that all the constraints are observed. There is another method whereby parasitic elements are provided as placement and routing constraints (see, for example, Unexamined Japanese Patent Publication No. 2002-93912 (page 5, FIG. 1)), but automatic placement reflecting the actually extracted constraints is not realized in either example.

However, with conventional technology, although it is possible for automatic extraction of placement and routing constraints necessary for automatic placement and routing to be implemented by a number of means, with regard to placement and routing constraints actually obtained by a conventional method, a means of reflecting constraints provided within a real-valued range, particularly for parasitic elements and inter-element variation, has not been realized.

SUMMARY OF THE INVENTION

It is an object of the present invention to provide a semiconductor integrated circuit manufacturing method and semiconductor integrated circuit manufacturing apparatus that implement an analog layout placement method enabling implementation of automatic placement that reflects constraints provided regarding parasitic elements and inter-element variation provided in a real-valued range.

According to an aspect of the invention, a semiconductor integrated circuit manufacturing method provided beforehand with a net list has a permissible range deciding step of setting a permissible range relating to an element; a floor plan step of creating a floor plan that satisfies the set permissible range using the net list; a placement step of placing elements using the created floor plan and extracting routing constraints that realize a permissible range for parasitic elements; and a routing step of routing in accordance with extracted routing constraints.

According to another aspect of the invention, a semiconductor integrated circuit manufacturing apparatus has a permissible range acquisition section that acquires a permissible range relating to an element; a floor plan section that creates a floor plan that satisfies the acquired permissible range; a placement section that places elements using the created floor plan and extracts routing constraints that realize a permissible range for parasitic elements; and a routing section that routes in accordance with extracted routing constraints.

BRIEF DESCRIPTION OF THE DRAWINGS

The above and other objects and features of the invention will appear more fully hereinafter from a consideration of the following description taken in conjunction with the accompanying drawing wherein one example is illustrated by way of example, in which.

DESCRIPTION OF THE PREFERRED EMBODIMENTS

With reference now to the accompanying drawings, embodiments of the present invention will be explained in detail below. The present invention is in no way limited to these embodiments, and various variations and modifications may be possible without departing from the scope of the present invention.

Figure 1:
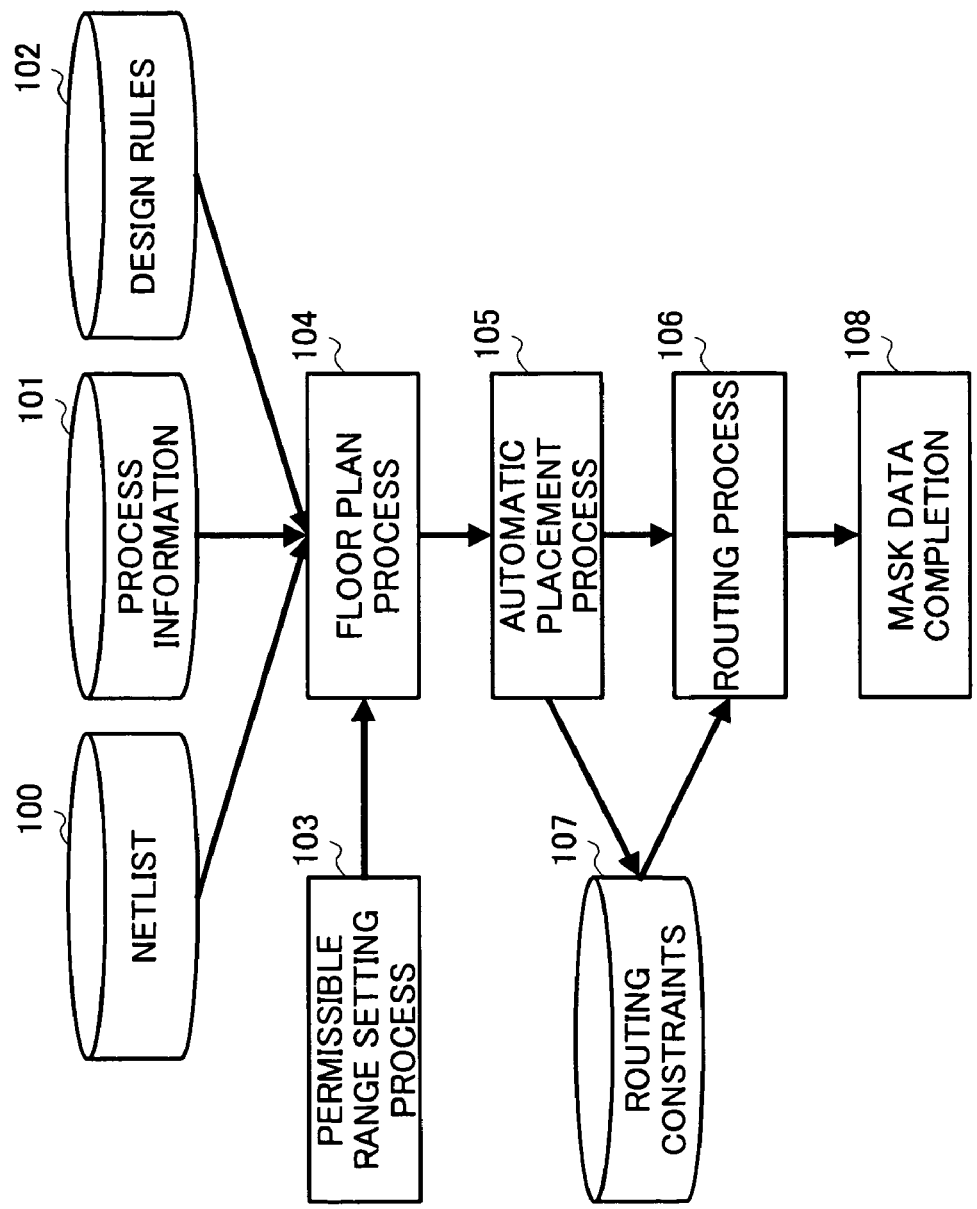
FIG. 1 is a flowchart of a semiconductor integrated circuit manufacturing apparatus and manufacturing method that perform automatic layout placement according to an embodiment of the present invention.

The processing flow constituting an overview of the present invention will be described using FIG. 1. FIG. 1 is a drawing showing the processing flow of a semiconductor integrated circuit manufacturing apparatus and manufacturing method that perform automatic layout placement of the present invention.

First, a net list 100 defines circuit connection information. An entity in which the types of elements included in a circuit, element instance names, element sizes, inter-element connection information, and so forth are described is defined as a net list.

In process information 101, an entity giving sheet resistance values of resistance elements and wiring, sheet capacitance values generated by capacitance elements and between layers (including the bridge capacitance and coupling capacitance of each layer), inter-element variation (absolute variation, relative variation, etc., of inter-element distances, sizes, shapes, materials, and so forth) and such-like parameter values is defined as process information.

In design rules 102, element minimum dimensions, inter-element distances, wiring width, inter-wiring distances, and such-like layout design constraints are defined as design rules.

In permissible range setting process 103, parasitic element (parasitic resistance, parasitic capacitance, etc.) Ranges permitted for the circuit, and ranges for inter-element variation (absolute variation, relative variation, etc.) Are set. Permissible ranges are set as real numbers—that is, actual numeric values.

In floor plan process 104, a floor plan is implemented that satisfies the permissible ranges for circuit parasitic elements and permissible ranges for inter-element variation set in permissible range setting process 103. From the results of this process, routing constraints 107 for automatic placement processing, parasitic elements, and inter-element variation are extracted automatically in automatic placement process 105 (placement process). In routing process 106, mask data is created via routing processing in accordance with automatically extracted routing constraints 107 (mask data completion 108).

Figure 2:
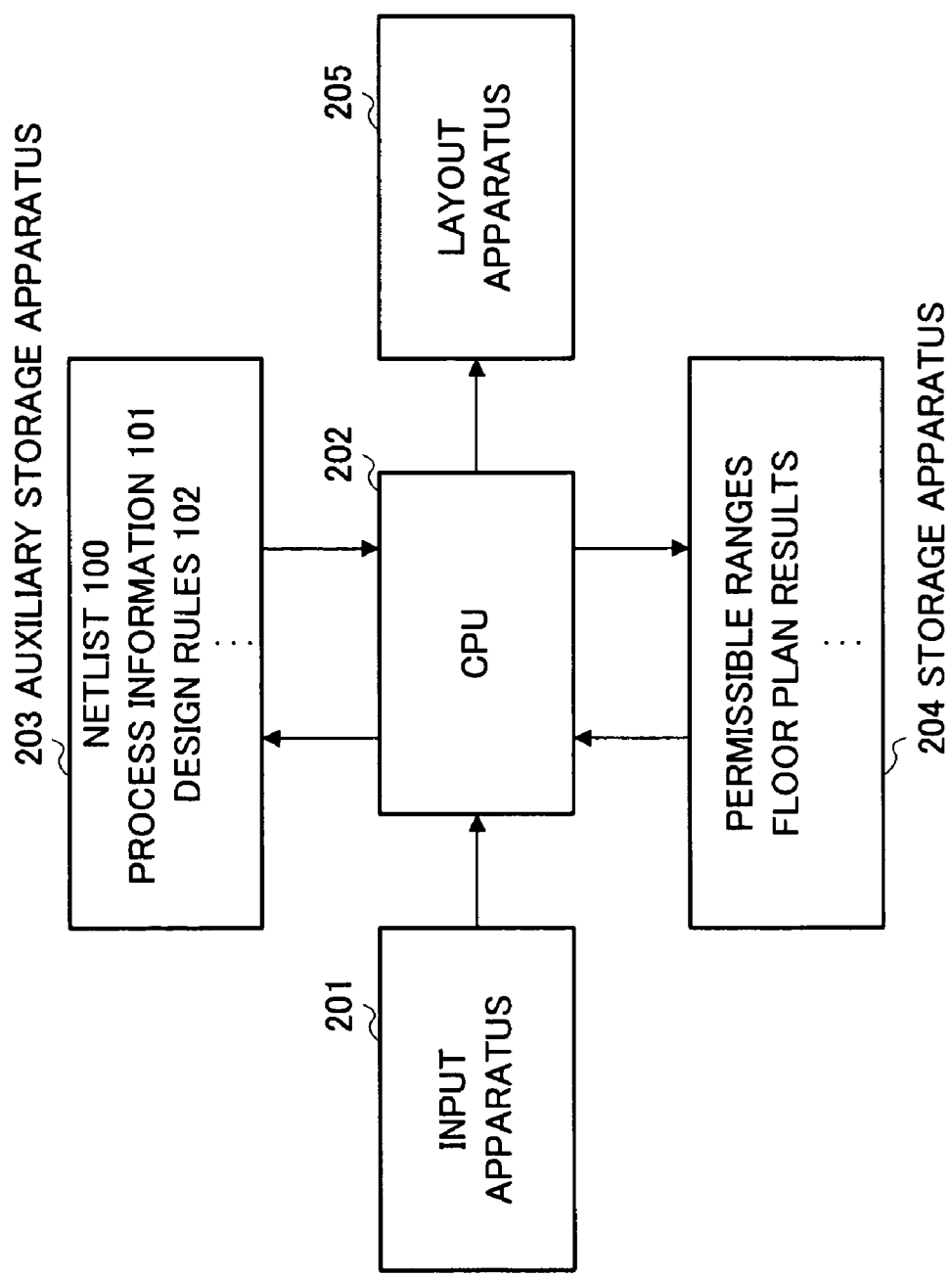
FIG. 2 is a block diagram of a semiconductor integrated circuit manufacturing apparatus that implements automatic layout placement according to this embodiment.

FIG. 2 is a block diagram of a semiconductor integrated circuit manufacturing apparatus that implements automatic layout placement according to this embodiment. Partial or total automation of the processing steps (processes) can easily be implemented using the kind of configuration shown in FIG. 2. The apparatuses in FIG. 2 comprise an input apparatus 201, a CPU (Central Processing Unit) 202, an auxiliary storage apparatus 203, a storage apparatus 204, and a layout apparatus 205.

As shown in FIG. 2, permissible ranges for parasitic elements and inter-element variation are input from input apparatus 201 and stored in storage apparatus 204. Net list 100, process information 101, and design rules 102 are prepared in advance, and stored in auxiliary storage apparatus 203. By having CPU 202 execute a program while referencing net list 100, process information 101, and design rules 102, floor plan results are calculated and are stored in storage apparatus 204. Layout apparatus 205 is operated by CPU 202 while referencing the floor plan results, and mask data is created.

This completes the overview of the semiconductor integrated circuit manufacturing apparatus and method.

Embodiment 1

Figure 3:
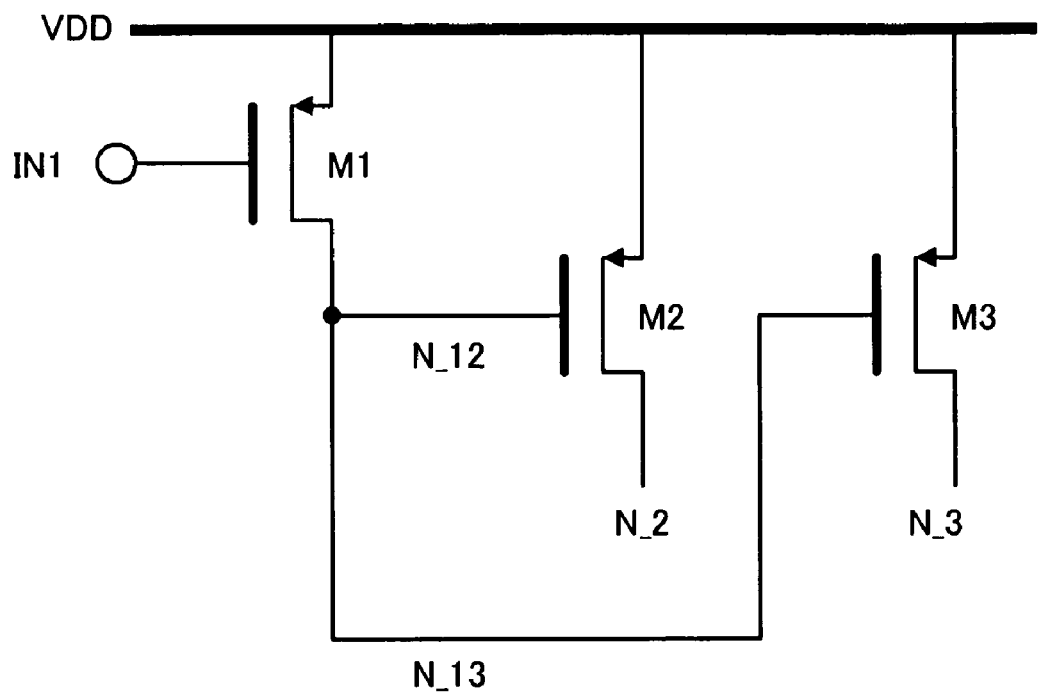
FIG. 3 is a circuit diagram showing circuit example 1 used in Embodiment 1.

In Embodiment 1, processing that creates a floor plan using permissible ranges is described. FIG. 3 is a circuit diagram showing circuit example 1 used in Embodiment 1. In permissible range setting process 103 in FIG. 1, in a circuit comprising PROS (Positive Metal Oxide Semiconductor) transistors Mr., MD, and Me such as shown in FIG. 3, the path connecting the M1 gate terminal and the terminal to the outside is designated IN1, the path connecting the M1 drain terminal and M2 gate terminal is designated N_12, and the path connecting the M1 drain terminal and M3 gate terminal is designated N_13.

In order for the circuit to satisfy its characteristics with paths connecting the respective terminals, permissible ranges for parasitic elements are given as follows, as shown in Table 1: for N_12, parasitic resistance of 3.42 to 7.12 [Ω], and parasitic capacitance of 0.57 to 9.15 [FF]; for N_13, parasitic resistance of 3.42 to 5.27 [Ω], and parasitic capacitance of 0.57 to 4.58 [FF]; and for IN1, parasitic resistance of 2.59 to 21.11 [Ω], and parasitic capacitance of 0.57 to 12.01 [FF].

[Table 1]

Figure 4:
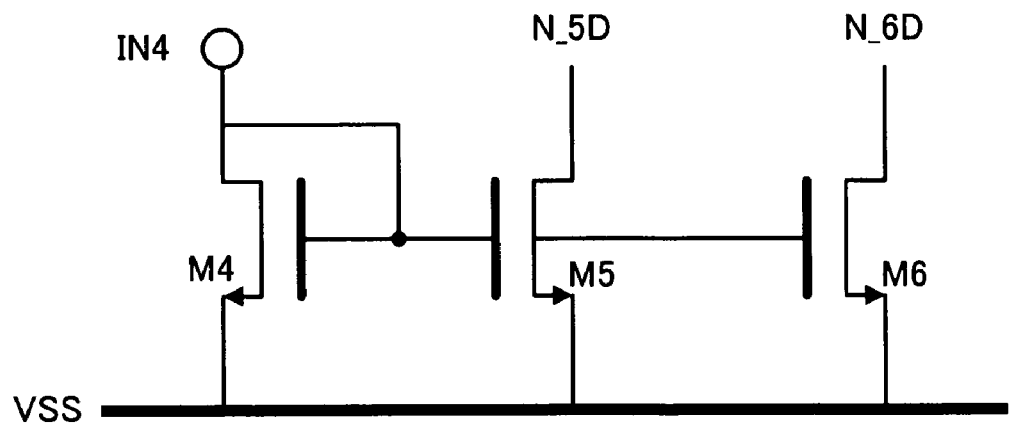
FIG. 4 is a circuit diagram showing circuit example 2 used in Embodiment 1.

FIG. 4 is a circuit diagram showing circuit example 2 used in Embodiment 1. Similarly, with regard to inter-element variation, in a current mirror circuit comprising NODS (Negative Metal Oxide Semiconductor) transistors M4, M5, and M6 such as shown in FIG. 4, permissible ranges for inter-element variation in order for the circuit to satisfy its characteristics are given as follows, as shown in Table 2: −4.1 to +4.7 [%] between M4 and M5; −1.9 to +2.2 [%] between M4 and M6; and so forth.

[Table 2]

Details of floor plan process 104 in FIG. 1 will now be described by means of the flowchart shown in FIG. 5. In relative placement calculation process 401, relative placement relationships of elements of circuit example 1 are calculated from previously prepared net list 100 connection information. FIG. 6 is a drawing of the relative placement relationships of elements of circuit example 1 (FIG. 3) in Embodiment 1, with FIG. 6 (A) showing the relative placement relationship of elements obtained from the connectional relationship, and FIG. 6 (B) showing the relative placement relationship of elements with parasitic elements taken into consideration. The placement results for the circuit in FIG. 3 are as shown in FIG. 6 (A), but if permissible ranges for parasitic elements are added thereto as conditions, with regard to M2 and M3, since the permissible ranges for parasitic elements for N_13 are smaller than for N_12, the placement positions of M2 and M3 are switched in order to shorten the N_13 wiring distance. Thus, as shown in FIG. 6 (B), a relative placement result of elements in which M3 is nearer M1 than M2 can be calculated.

Figure 7:
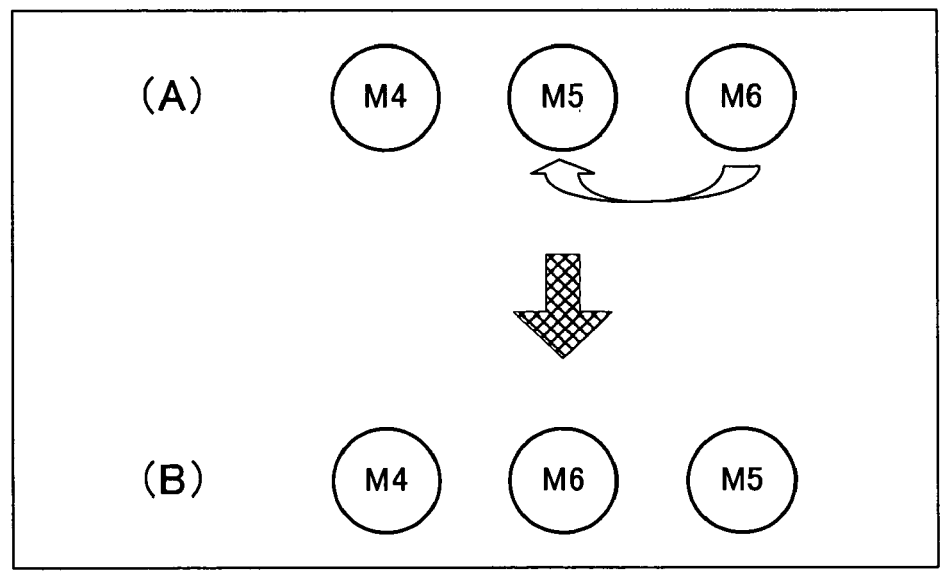
FIG. 7 is a drawing of the relative placement relationships of elements of circuit example 2 in Embodiment 1.

Similarly, in relative placement calculation process 401, relative placement relationships of elements of circuit example 2 are calculated from previously prepared net list 100 connection information. FIG. 7 is a drawing of the relative placement relationships of elements of circuit example 2 (FIG. 4) in Embodiment 1, with FIG. 7 (A) showing the relative placement relationship of elements obtained from the connectional relationship, and FIG. 7 (B) showing the relative placement relationship of elements with inter-element variation taken into consideration. The placement results for the circuit in FIG. 4 are as shown in FIG. 7 (A), but if permissible ranges for inter-element variation are added thereto as conditions, with regard to M5 and M6, since the permissible range for inter-element variation is smaller between M4 and M6 than between M4 and M5, the placement positions of M2 and M3 are switched in order to shorten the M4-M6 inter-element distance. Thus, as shown in FIG. 7 (B), a relative placement result of elements in which M6 is nearer M4 than M5 can be calculated.

Figure 8:
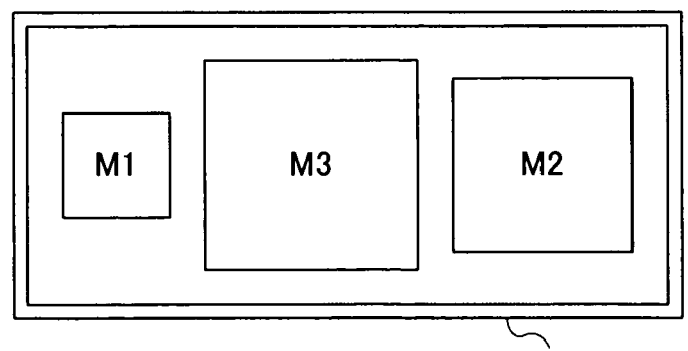
FIG. 8 is a drawing of the initial placement of elements of circuit example 1 in Embodiment 1.

FIG. 8 is a drawing showing an example of the initial placement of elements of circuit example 1 in Embodiment 1. In initial placement process 402 in FIG. 5, the respective elements are placed in a configuration such that the area of each element is minimized based on the relative placement result in FIG. 6 (B), as shown in FIG. 8.

However, when inter-element variation (absolute variation and relative variation) permissible ranges are given here, placement is performed in an element placement pattern in accordance with those inter-element variation ranges.

Figure 9:
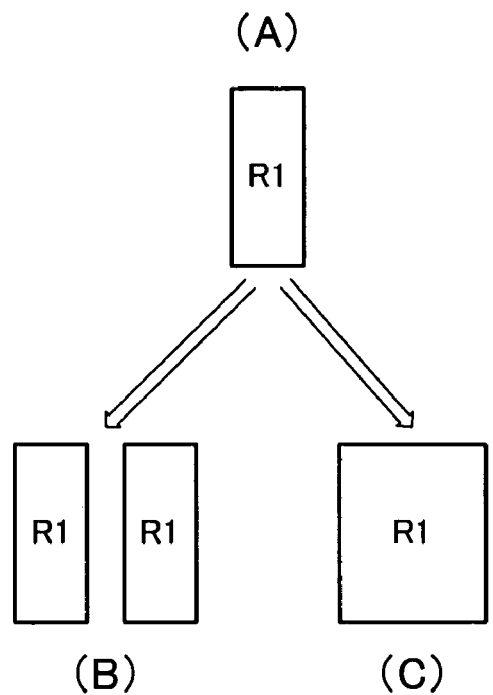
FIG. 9 is a drawing of element placement forms according to absolute variation in Embodiment 1.

FIG. 9 is a drawing showing examples of the element placement form according to absolute variation in Embodiment 1. FIG. 9 (A) is an example of the inter-element placement form when inter-element variation is within the permissible range, and FIG. 9 (B) and (C) are examples of the inter-element placement form when inter-element variation is outside the permissible range. Inter-element variation (assuming absolute variation of an element when only one element is specified) will now be explained taking resistance element R1 in FIG. 9 as an example. The absolute variation of R1 is calculated from information relating to absolute variation precision included in process information 101 in FIG. 5, and if this is within the permissible range, placement is performed directly as shown in FIG. 9 (A).

On the other hand, if the absolute variation of R1 is outside the permissible range, a placement pattern including element material, number of divisions, shape, and so forth, is calculated from process information 101 with R1 divided in parallel form (FIG. 9 (B)) or so that the R1 resistance width is increased (FIG. 9 (C)), and placement is performed so as to satisfy the absolute variation permissible range.

Figure 10:
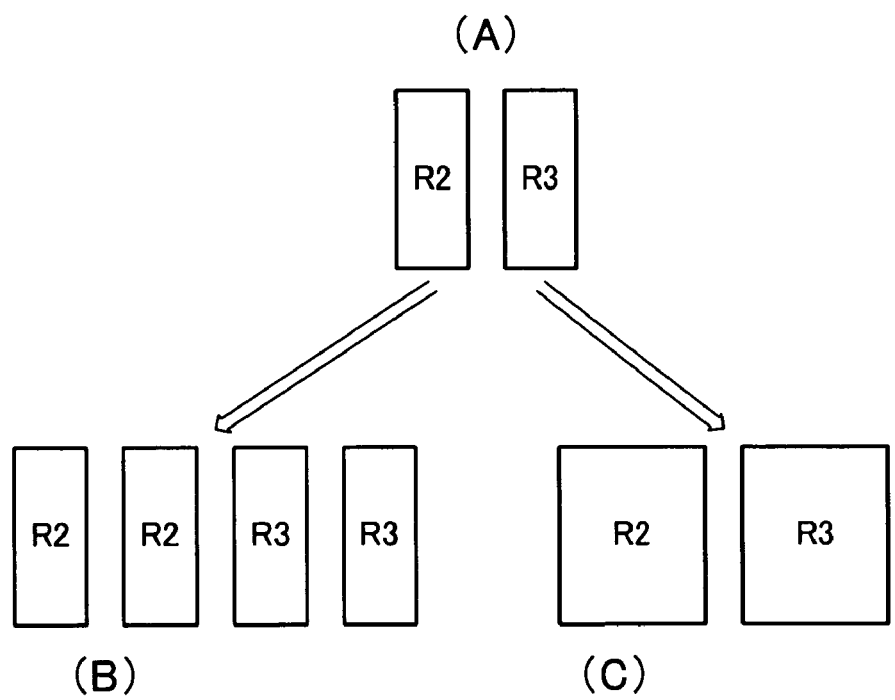
FIG. 10 is a drawing of element placement forms according to relative variation in Embodiment 1.

FIG. 10 is a drawing showing examples of the element placement form according to relative variation in Embodiment 1. FIG. 10 (A) is an example of the inter-element placement form when inter-element variation is within the permissible range, and FIG. 10 (B) and (C) are examples of the inter-element placement form when inter-element variation is outside the permissible range. As in FIG. 9, inter-element variation (assuming relative variation between elements when two or more elements are specified) will now be explained taking a circuit comprising resistance elements R2 and R3 as shown in FIG. 10 as an example. The relative variation of R2 and R3 is calculated from information relating to relative variation precision included in process information 101 in FIG. 5, and if this is within the permissible range, placement is performed directly as shown in FIG. 10 (A).

On the other hand, if the relative variation of R2 and R3 is outside the permissible range, a placement pattern including element material, number of divisions, shape, and so forth, is calculated from process information 101 with R2 and R3 each divided in parallel form (FIG. 10 (B)) or so that the R2 and R3 resistance widths are increased (FIG. 10 (C)), and placement is performed so as to satisfy the relative variation permissible range.

Figure 5:
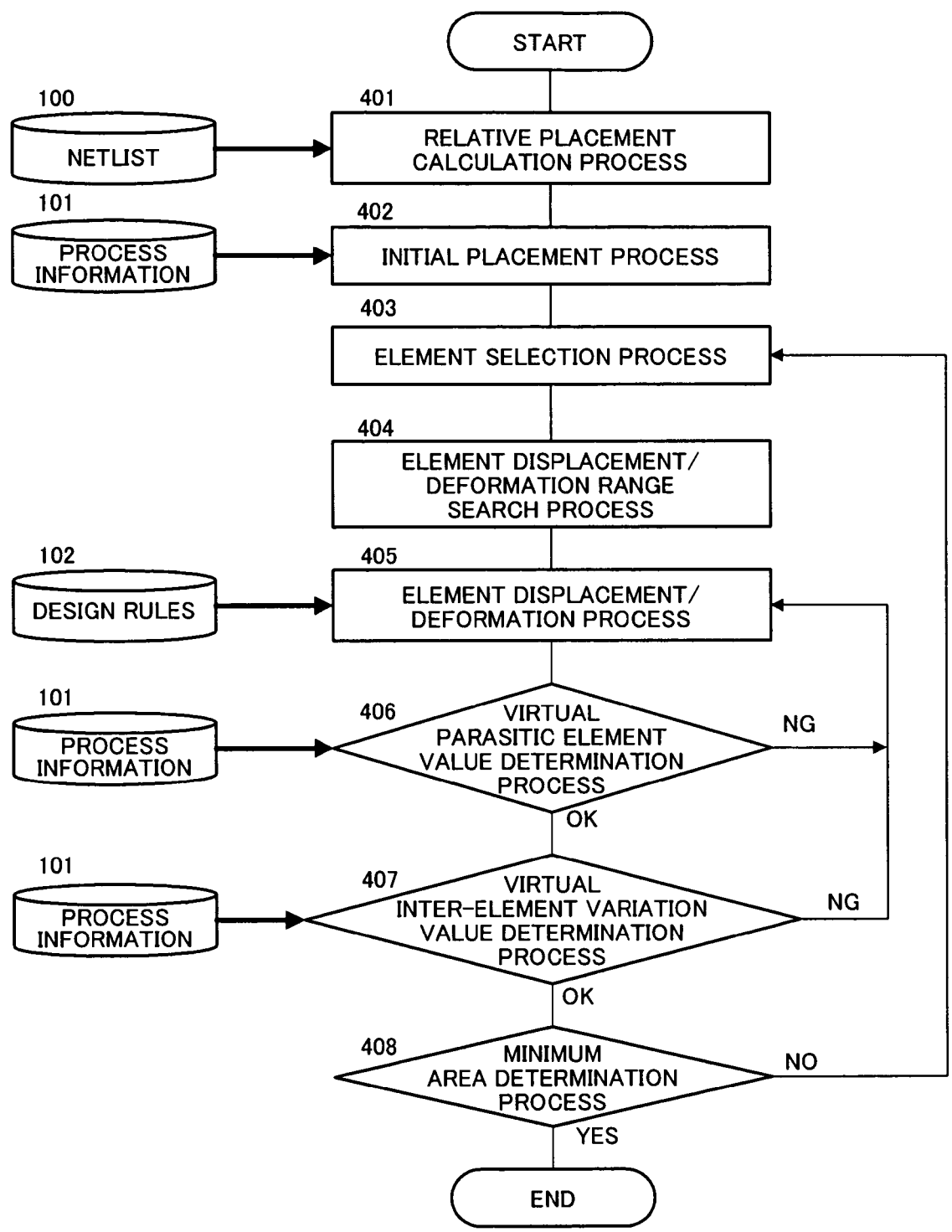
FIG. 5 is a flowchart of the floor plan process in Embodiment 1.
Figure 6:
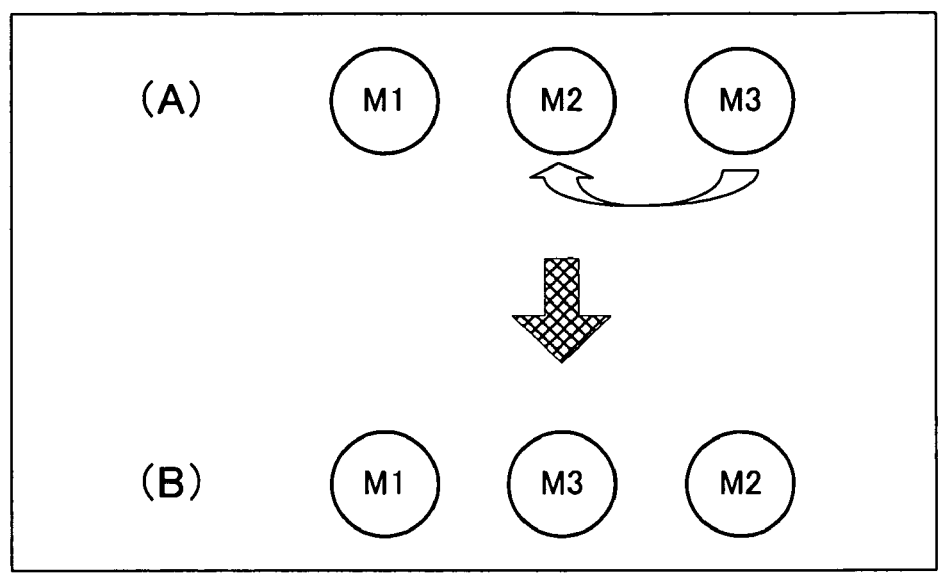
FIG. 6 is a drawing of the relative placement relationships of elements of circuit example 1 in Embodiment 1.

In element selection process 403 in FIG. 5, a portion from which an area in which elements are placed is eliminated from the layout area is made an empty area, and one of the adjacent elements in that empty area is determined appropriately from the parasitic element and inter-element variation permissible ranges and selected as an object of displacement and deformation.

In element displacement/deformation range search process 404 in FIG. 5, for the element selected in element selection process 403, a range is searched for that enables the relative positionally relationship with other elements calculated from relative placement calculation process 401 to be maintained within the layout area, and is provided as the displacement/deformation permissible range of the selected element.

In element displacement/deformation process 405 in FIG. 5, element displacement or deformation (including use of a rectangular shape or a polygonal shape when element division is possible) is performed in accordance with design rules 102 so that contiguous empty areas are reduced within the element displacement/deformation permissible range given by element displacement/deformation range search process 404.

Figure 11:
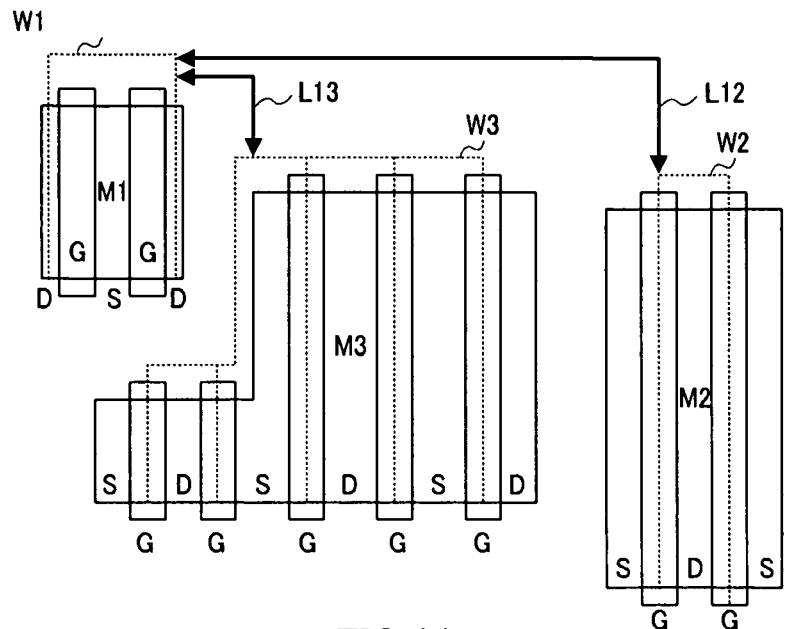
FIG. 11 is a drawing of virtual wiring lengths of circuit example 1 in Embodiment 1.

The method of calculating virtual parasitic element values that occur due to element placement positions and element shapes in virtual parasitic element value determination process 406 in FIG. 5 will now be explained for the circuit in FIG. 3 using FIG. 11. FIG. 11 is a drawing showing an example of virtual wiring lengths of circuit example 1 in Embodiment 1. In path N_12, N_12 virtual wiring is determined by adding together wiring L12 of the shortest distance connecting M1 and M2, and wiring W1 in the M1 area and wiring W2 in the M2 area; and similarly, in path N_13, N_13 virtual wiring is determined by adding together wiring L13 of the shortest distance connecting M1 and M2, and wiring We in the M1 area and wiring We in the M3 area.

From the virtual wiring and process information 101, virtual parasitic element values for virtual wiring in accordance with element placement positions and element shapes are found for the respective paths. It is then determined whether or not the calculated virtual parasitic element values satisfy the permissible ranges for parasitic elements of the respective paths, and if the conditions are not satisfied, the processing flow returns to element displacement/deformation process 405 and processing is repeated.

Figure 12:
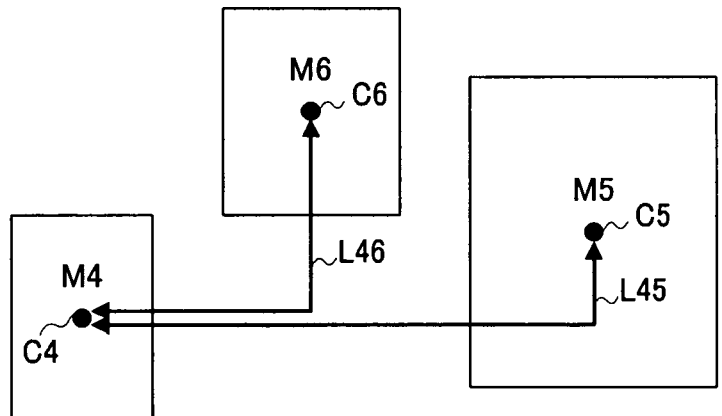
FIG. 12 is a drawing of virtual inter-element distances of circuit example 2 in Embodiment 1.

The method of calculating virtual inter-element variation values that occur due to element placement positions and element shapes in virtual inter-element variation value determination process 407 in FIG. 5 will now be explained for the circuit in FIG. 4 using FIG. 12. FIG. 12 is a drawing showing an example of virtual inter-element distances of circuit example 2 in Embodiment 1. The inter-element variation value for inter-element distance Lag is calculated from inter-element distance Lag connecting M4 barycenter C4 and M5 barycenter C5, and process information 101; and the inter-element variation value for inter-element distance L46 is calculated from inter-element distance L46 connecting M4 barycenter C4 and M6 barycenter C6, and process information 101. In this way, virtual inter-element variation values in accordance with element placement positions and element shapes are found between the respective elements.

It is then determined whether or not the calculated virtual inter-element variation values satisfy the permissible ranges for the respective inter-element variations, and if the conditions are not satisfied, the processing flow returns to element displacement/deformation process 405 and processing is repeated.

Figure 13:
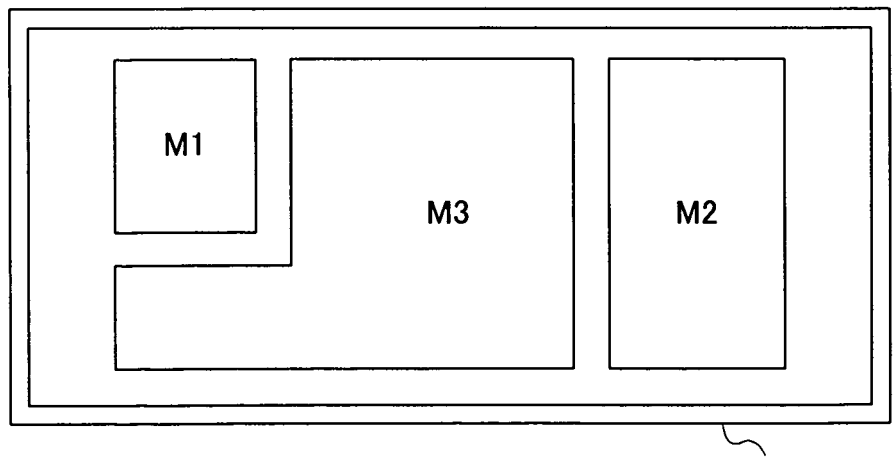
FIG. 13 is a drawing of element placement completion for circuit example 1 in Embodiment 1.

In minimum area determination process 408 in FIG. 5, the surface area of the area in which elements are placed (including empty areas between elements) is calculated, and the processing in 403 to 407 is repeated until this area is minimal. FIG. 13 is a drawing showing an example of element placement completion for circuit example 1 in Embodiment 1. As a result of repeating the processing in 403 to 407, element placement positions and placement shapes are finally decided as shown in FIG. 13.

In automatic placement process 105 in FIG. 1, placement is performed in accordance with the element placement positions and placement shapes decide in floor plan process 104. At the same time as element placement, routing constraints are also automatically extracted to ensure that parasitic element and inter-element variation permissible ranges are not exceeded by routing (wiring) in the following routing process 106.

First, for parasitic elements, to give an explanation for path N__12 in FIG. 11, when element placement is decided, wiring W1 in the element M1 area and wiring W2 in the element M2 area are also decided, and therefore parasitic element values for W1 and W2 can be calculated. Then the remainder after subtracting the W1 and W2 parasitic element values from the permissible range for N__12 parasitic elements is taken as the parasitic element permissible range for inter-element distance L12 wiring, and wiring width, wiring length, wiring layer, number of contacts, contact shape, number of bends (turnoffs), and so forth are set as routing constraints 107 and conveyed to routing process 106 so that parasitic element values for L12 do not exceed the permissible range. The same applies to path N__13. Also, when process variation information relating to wiring, contacts, and so forth is provided, wiring width, wiring length, wiring layer, number of contacts, contact shape, number of bends (turnoffs), and so forth are set as routing constraints 107 and conveyed to routing process 106 so that virtual parasitic element values for which the amount of fluctuation due to variation has further been calculated do not exceed the permissible range.

Next, for inter-element variation, a virtual inter-element variation value for the distance between element barycenters is subtracted from the permissible range for inter-element variation (relative variation). Wiring width, wiring length, number of bends (turnoffs) number of changes between wiring layers, contact shape and number of bends (turnoffs) at the time of a changeover, and so forth for each wiring layer of nodes connecting elements are unified from the remaining virtual inter-element variation value, and are set as routing constraints 107 and conveyed to routing process 106 so that the permissible range of inter-element variation (relative variation) is not exceeded by routing (wiring).

In routing process 106 in FIG. 1, routing is performed in accordance with routing constraints 107 conveyed from automatic placement process 105 to ensure that permissible ranges for parasitic elements and permissible ranges for inter-element variation are not exceeded.

By means of the above-described procedures, element placement is implemented whereby the surface area in which there are few empty areas is kept to a minimum while meeting constraints due to parasitic elements or inter-element variation.

Embodiment 2

Figure 14:
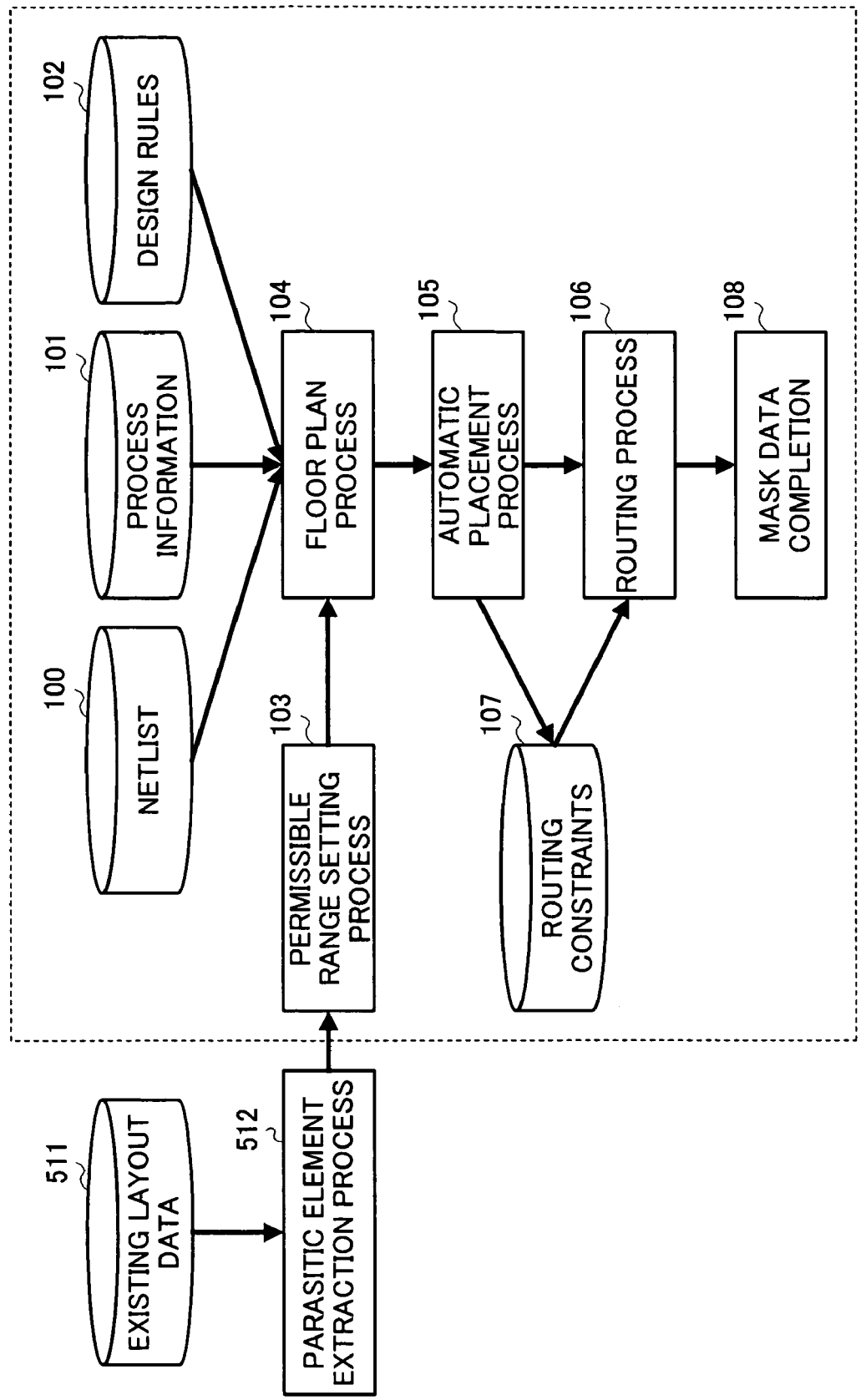
FIG. 14 is a flowchart showing an example of the operation of the permissible range setting section for parasitic elements in Embodiment 2.

In Embodiment 2, a means of setting (acquiring) permissible ranges for parasitic elements using parasitic elements extracted from existing layout data is described, using FIG. 14. FIG. 14 is a flowchart showing an example of the operation of the permissible range setting section for parasitic elements in Embodiment 2.

Parasitic element extraction is performed in parasitic element extraction process 512 from one or a plurality of existing layout data 511 designed beforehand in a circuit configuration whose layout form is different or similar in the same circuit configuration, and parasitic element values (parasitic resistance values, parasitic capacitance values, etc.) Are obtained. Next, these parasitic element values are conveyed to permissible range setting process 103 as permissible ranges for parasitic elements.

In this way, permissible range setting process 103 can use parasitic element values extracted from existing layout data 511.

Embodiment 3

Figure 15:
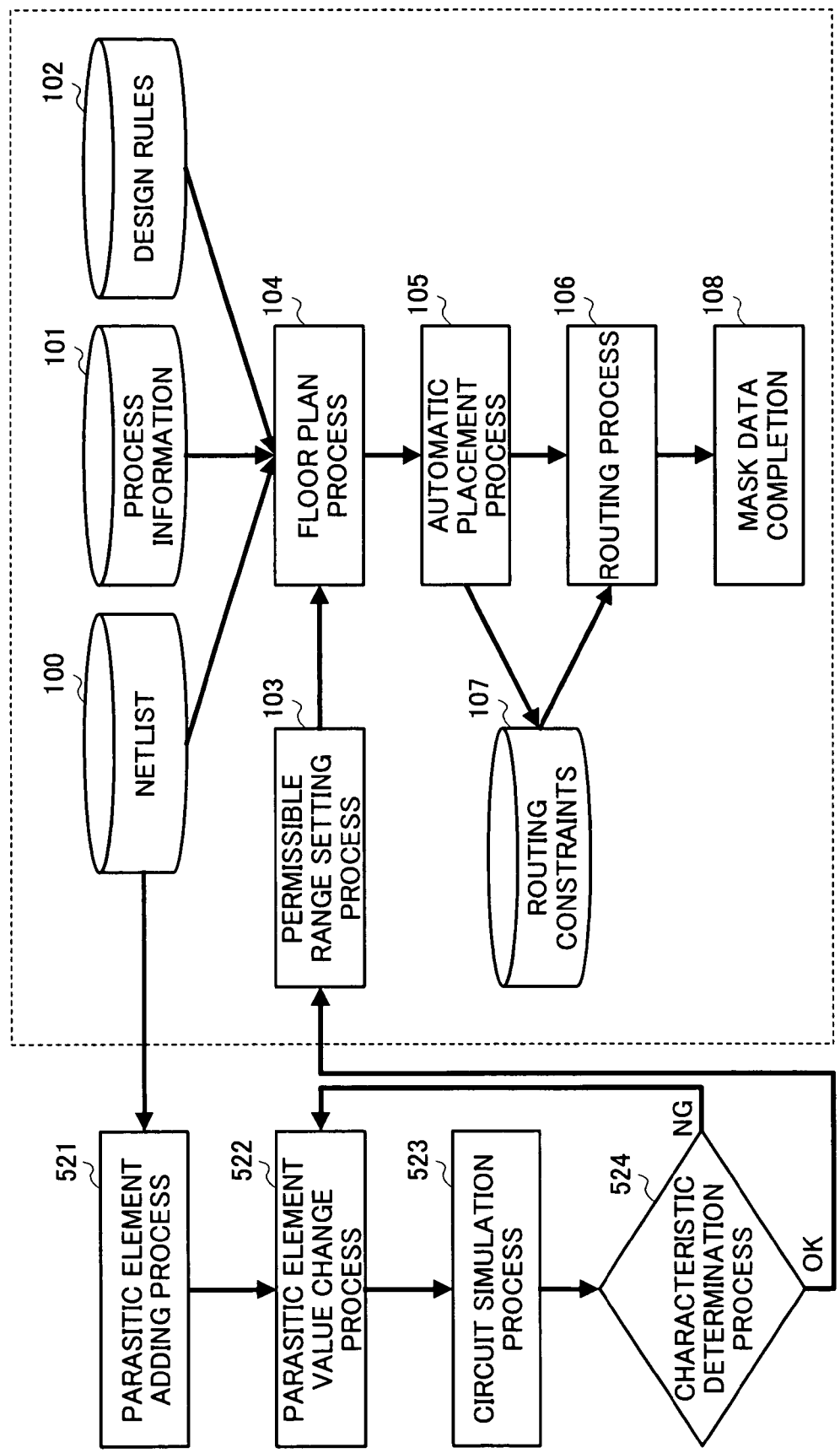
FIG. 15 is a flowchart of the permissible range setting section for parasitic elements in Embodiment 3.

In Embodiment 3, a means of conveying permissible ranges for parasitic elements from the results of inserting a parasitic element (parasitic resistance, parasitic capacitance, etc.) at each node and executing circuit simulation is described, using FIG. 15. FIG. 15 is a flowchart showing an example of the operation of the permissible range setting section for parasitic elements in Embodiment 3. In Embodiment 3, net list 100 is used.

In parasitic element adding process 521, connectional relationships are extracted from net list 100 prepared beforehand, and parasitic elements (parasitic resistance between terminals, parasitic capacitance between substrate and wiring, etc.) Are added between different terminals such as an element terminal and external terminal, and parasitic elements (parasitic resistance between wiring, etc.) Are added between different nodes, for all or some nodes or between nodes. Then added parasitic element values are increased or decreased in parasitic element value change process 522. Circuit simulation is executed in circuit simulation process 523. Characteristic results from circuit simulation are determined in characteristic determination process 524. Parasitic element value change process 522 through characteristic determination process 524 are performed repeatedly and a range of parasitic element values that satisfies the characteristics is identified, and this is conveyed to permissible range setting process 103 as a permissible range for parasitic elements.

In this way, permissible range setting process 103 can obtain parasitic element values identified by performing circuit simulation using connectional relationships extracted from net list 100.

Embodiment 4

Figure 16:
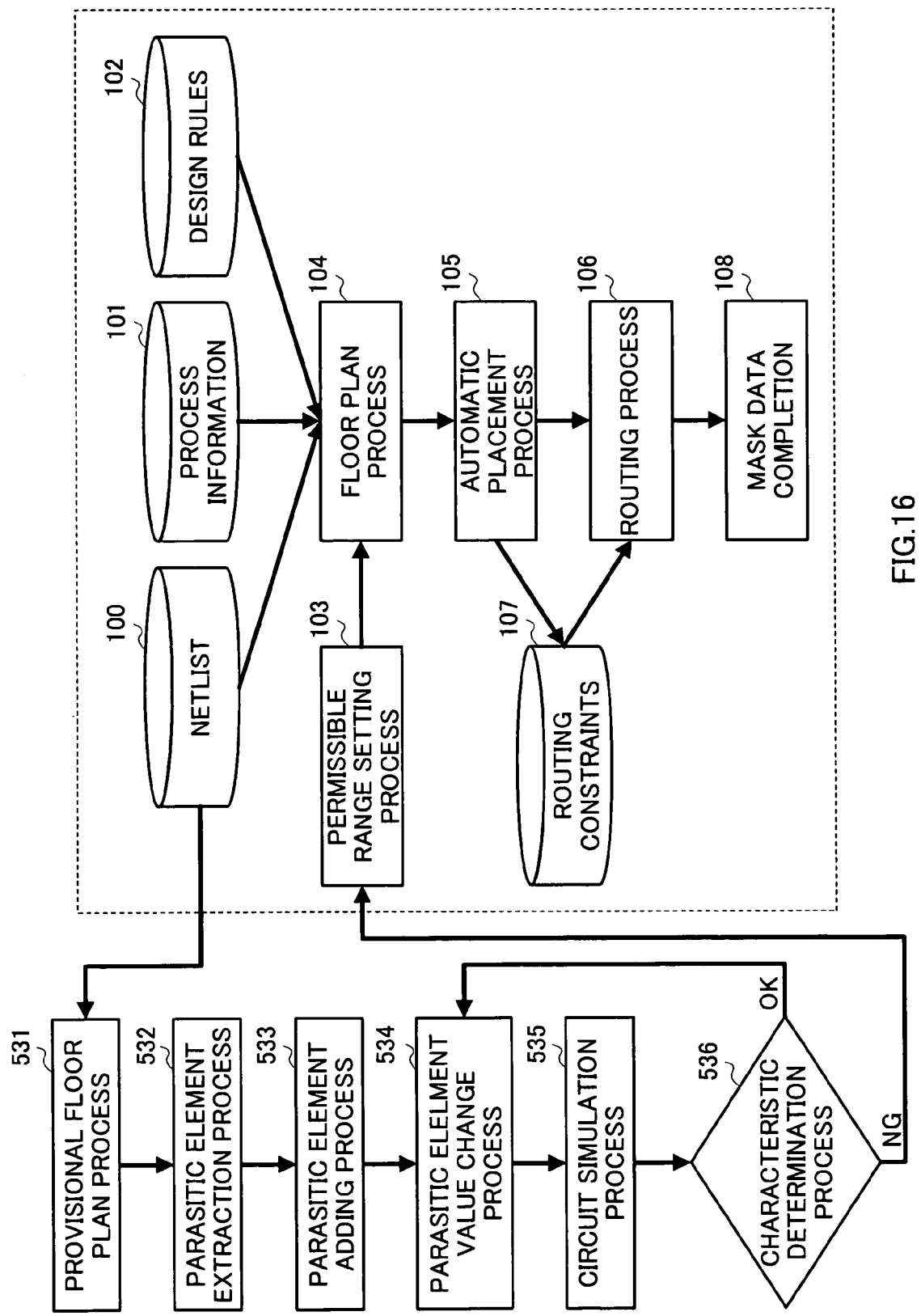
FIG. 16 is a flowchart of the permissible range setting section for parasitic elements in Embodiment 4.

In Embodiment 4, a means of extracting parasitic elements from provisional floor plan results, and conveying permissible ranges for parasitic elements via circuit simulation including parasitic elements is described, using FIG. 16. FIG. 16 is a flowchart showing an example of the operation of the permissible range setting section for parasitic elements in Embodiment 4.

In provisional floor plan process 531, connectional relationships are extracted from net list 100 prepared beforehand, a provisional floor plan is executed with connection information only, and elements are roughly placed. Then parasitic element values are obtained by parasitic element extraction in parasitic element extraction process 532. In parasitic element adding process 533, parasitic elements are added to the relevant nodes. Parasitic element values are increased or decreased in parasitic element value change process 534. Circuit simulation is executed in circuit simulation process 535. Characteristic results from circuit simulation are determined in characteristic determination process 536. Parasitic element value change process 534 through characteristic determination process 536 are performed repeatedly and a range of parasitic element values that satisfies the characteristics is identified, and this is conveyed to permissible range setting process 103 as a permissible range for parasitic elements.

In this way, permissible range setting process 103 can obtain parasitic element values identified by performing circuit simulation using connectional relationships extracted from net list 100.

Embodiment 5

Figure 17:
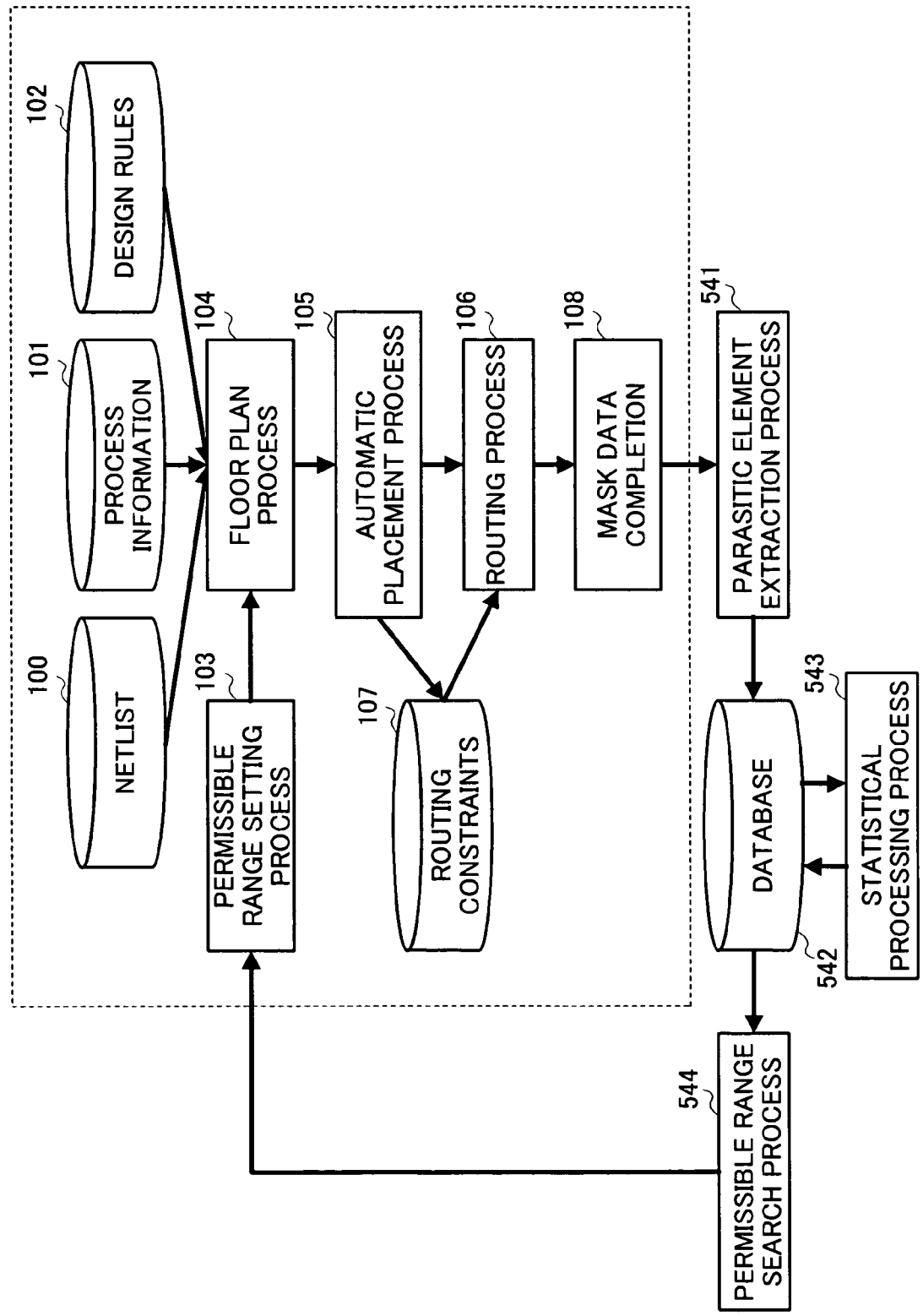
FIG. 17 is a flowchart of the permissible range setting section for parasitic elements in Embodiment 5.

In Embodiment 5, a means of conveying permissible ranges for parasitic elements from a database that stores mask data is described, using FIG. 17. FIG. 17 is a flowchart showing an example of the operation of the permissible range setting section for parasitic elements in Embodiment 5.

Mask data is assumed to be created by Embodiments 1 through 4, for example. In parasitic element extraction process 541, parasitic elements are extracted from the created mask data, and recorded and stored in database 542 together with parasitic element values, layout data, circuit information, process information, and so forth. Next, categorization is performed according to process, layout form, circuit topology, and so forth, and when a plurality of data exists for the same circuit configuration, statistical processing is carried out in statistical processing process 543, and recording in database 542 is performed.

In permissible range search process 544, database 542 is searched from the circuit configuration to be designed, and the closest data, such as items with the same circuit configuration or items for which parts of the circuit configuration or a combination thereof are the same, are conveyed to permissible range setting process 103 as permissible ranges for parasitic element values.

In this way, permissible range setting process 103 can obtain optimal parasitic element values from accumulated database 542.

Embodiment 6

Figure 18:
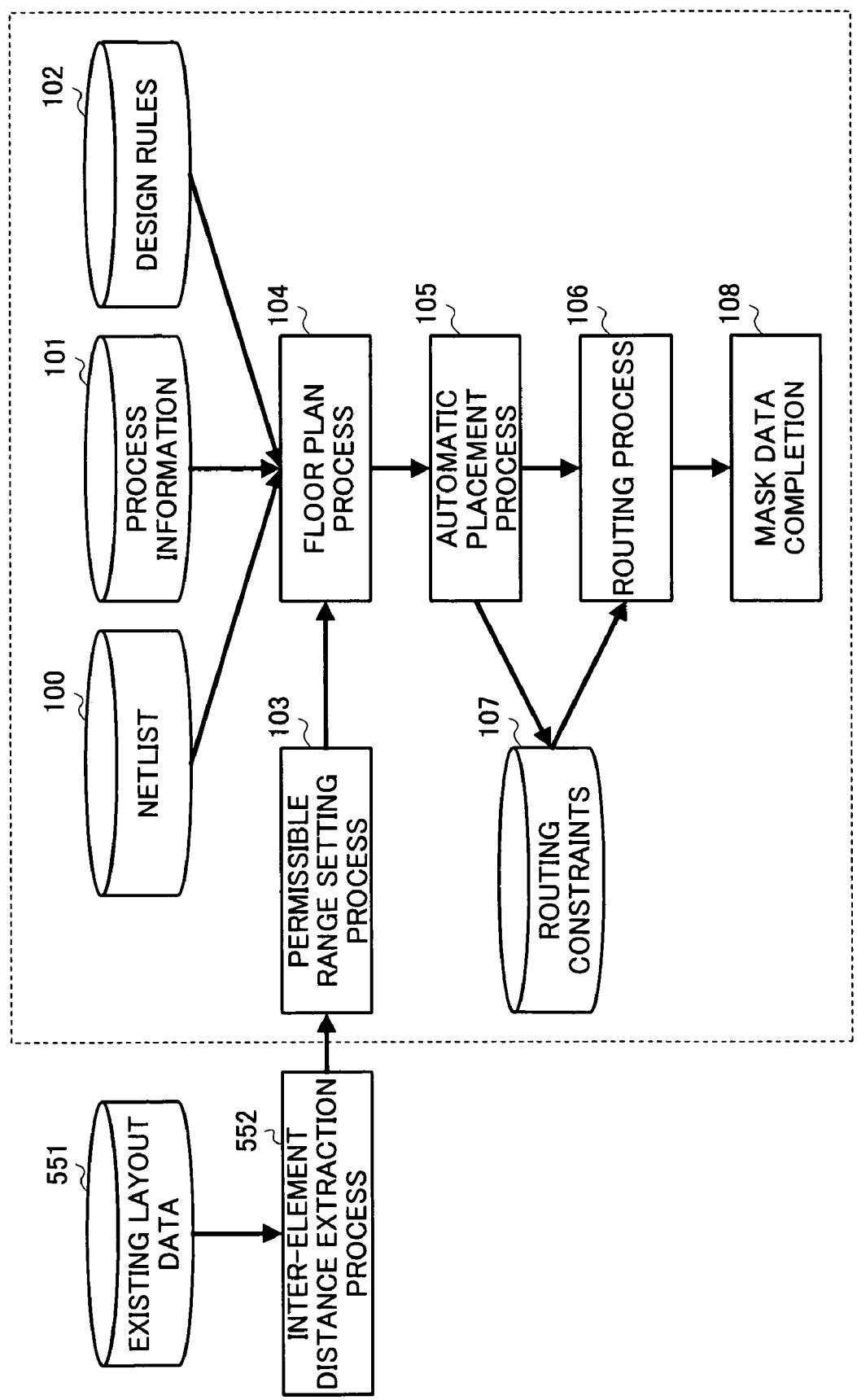
FIG. 18 is a flowchart of the permissible range setting section for element variation in Embodiment 6.

In Embodiment 6, a means of conveying permissible ranges for inter-element variation from inter-element distances extracted from existing layout data is described, using FIG. 18. FIG. 18 is a flowchart showing an example of the operation of the permissible range setting section for element variation in Embodiment 6.

Inter-element distance extraction is performed in inter-element distance extraction process 552 from one or a plurality of existing layout data 551 designed beforehand in the same circuit configuration with a different layout form or a similar circuit configuration, and variation values are obtained from process information 101 and inter-element distances. Next, these variation values are conveyed to permissible range setting process 103 as permissible ranges for inter-element variation.

In this way, permissible range setting process 103 can use inter-element distances extracted from existing layout data 551.

Embodiment 7

Figure 19:
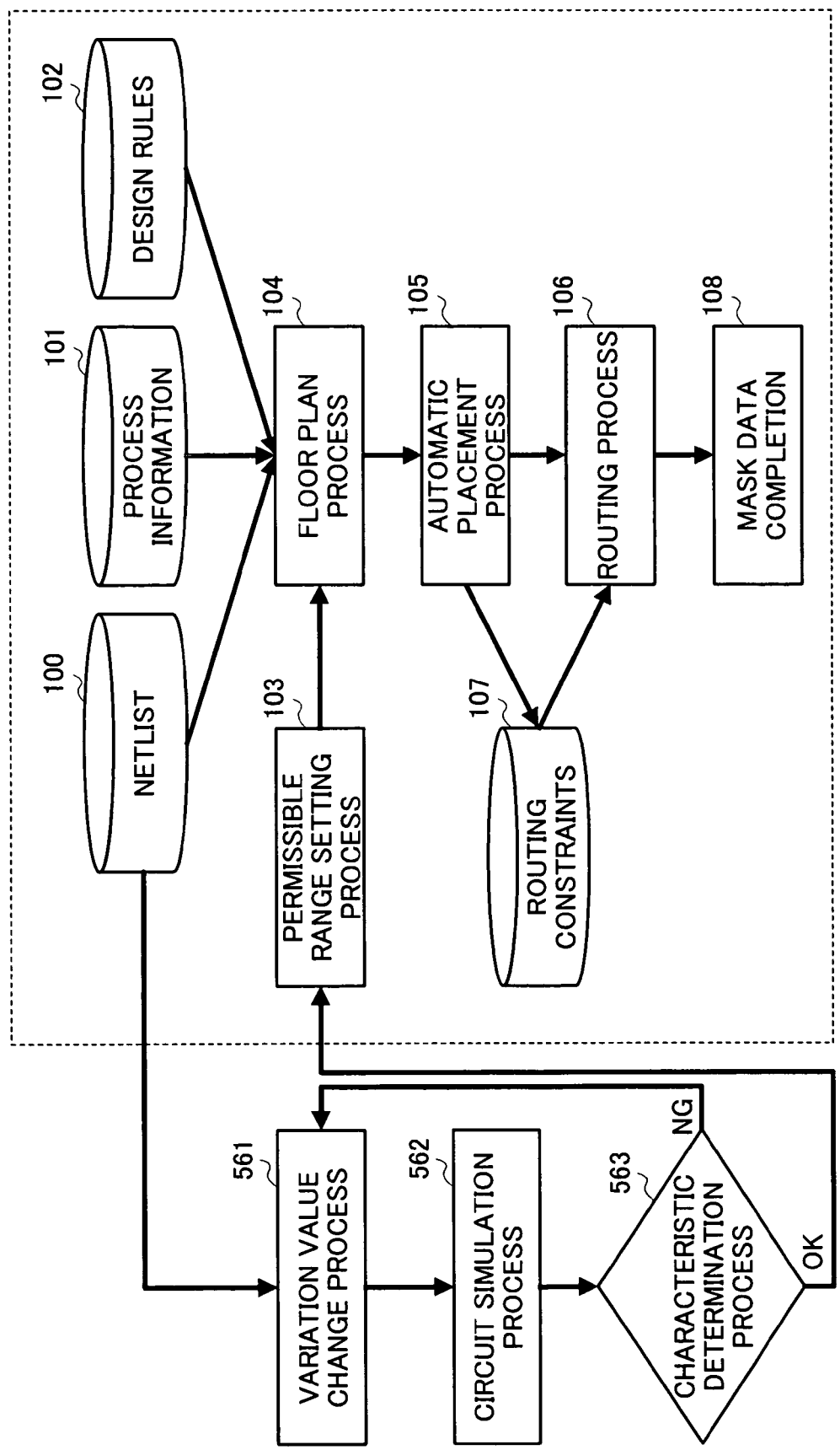
FIG. 19 is a flowchart of the permissible range setting section for element variation in Embodiment 7.

In Embodiment 7, a means of conveying permissible ranges for inter-element variation from the results of executing circuit simulation with individual element sizes or element parameters (length, width, etc.) increased or decreased is described, using FIG. 19. FIG. 19 is a flowchart showing an example of the operation of the permissible range setting section for element variation in Embodiment 7.

In variation value change process 561, elements are extracted from net list 100 prepared beforehand, and element size or element parameters are increased or decreased for all or some elements. Circuit simulation is executed in circuit simulation process 562. Characteristic results from circuit simulation are determined in characteristic determination process 563. Variation value change process 561 through characteristic determination process 563 are performed repeatedly and a range of variation values that satisfies the characteristics is identified, and this is conveyed to permissible range setting process 103 as a permissible range for inter-element variation values.

In this way, permissible range setting process 103 can obtain inter-element variation values identified by performing circuit simulation using connectional relationships extracted from net list 100.

Embodiment 8

Figure 20:
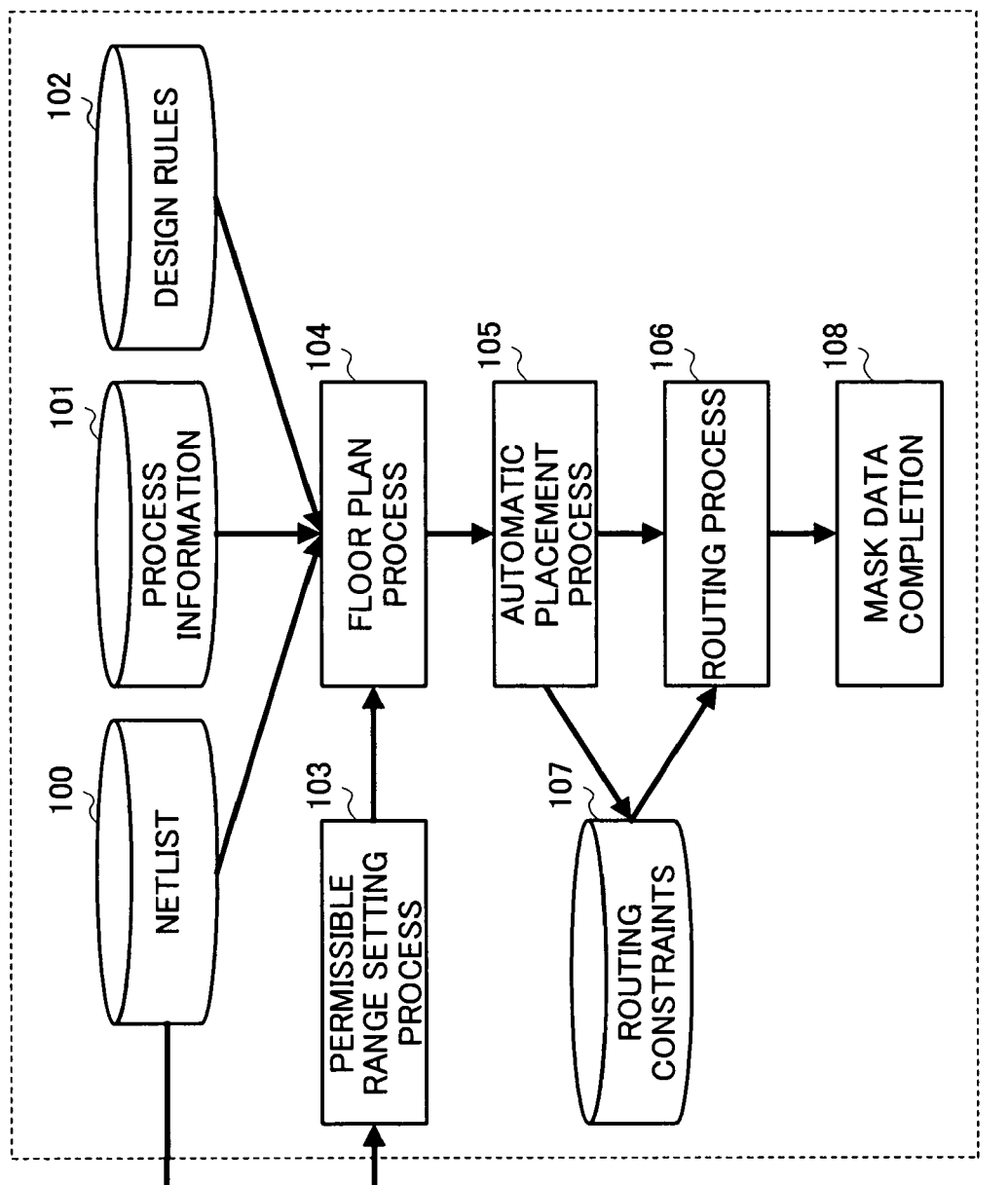
FIG. 20 is a flowchart of the permissible range setting section for element variation in Embodiment 8.

In Embodiment 8, a means of extracting inter-element distances from provisional floor plan results, and conveying permissible ranges for inter-element variation via circuit simulation including inter-element variation is described, using FIG. 20. FIG. 20 is a flowchart showing an example of the operation of the permissible range setting section for element variation in Embodiment 8.

In provisional floor plan process 571, connectional relationships are extracted from net list 100 prepared beforehand, a provisional floor plan is executed with connection information only, and elements are roughly placed. Then inter-element distance extraction is performed in inter-element distance extraction process 572, and variation values are calculated from process information 101 and inter-element distances. Inter-element variation values are increased or decreased in variation value change process 573. Circuit simulation is executed in circuit simulation process 574. Characteristic results from circuit simulation are determined in characteristic determination process 575. Variation value change process 573 through characteristic determination process 575 are performed repeatedly and a range of inter-element variation values that satisfies the characteristics is identified, and this is conveyed to permissible range setting process 103 as a permissible range for inter-element variation.

In this way, permissible range setting process 103 can obtain inter-element variation values identified by performing circuit simulation using connectional relationships extracted from net list 100.

Embodiment 9

Figure 21:
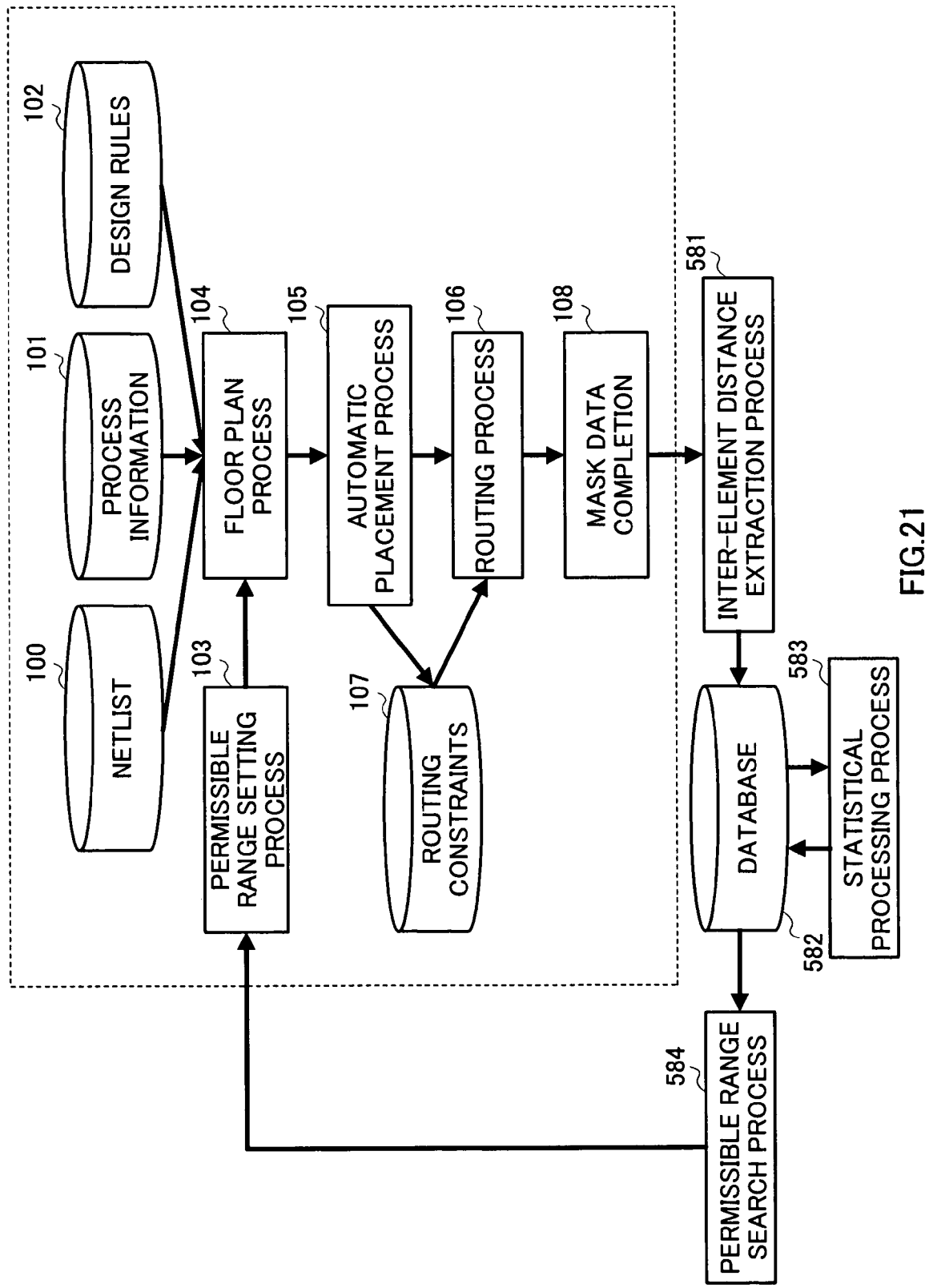
FIG. 21 is a flowchart of the permissible range setting section for element variation in Embodiment 9.

In Embodiment 9, a means of conveying permissible ranges for inter-element variation from a database that stores mask data is described, using FIG. 21. FIG. 21 is a flowchart showing an example of the operation of the permissible range setting section for element variation in Embodiment 9.

Mask data is assumed to be created by Embodiments 1 and 6 through 8, for example. In inter-element distance extraction process 581, inter-element distances are extracted from the mask data, and recorded and stored in database 582 together with inter-element variation values calculated from process information 101, layout data, circuit information, process information, and so forth. Next, categorization is performed according to process, layout form, circuit topology, and so forth, and when a plurality of data exists for the same circuit configuration, statistical processing is carried out in statistical processing process 583, and recording in database 582 is performed.

Next, in permissible range search process 584, database 582 is searched from the circuit configuration to be designed, and the closest data, such as items with the same circuit configuration or items for which parts of the circuit configuration or a combination thereof are the same, are conveyed to permissible range setting process 103 as permissible ranges for inter-element variation.

In this way, permissible range setting process 103 can obtain optimal inter-element distances from accumulated database 582.

Embodiment 10

The processes described in the above embodiments can be implemented by sections that execute the respective functions in an apparatus. It is also possible to implement the respective functions by means of a program. Each process is controlled and executed by CPU 202 shown in FIG. 2. In program execution, execution is performed using net list 100, process information 101, and design rules 102 stored in auxiliary storage apparatus 203 or storage apparatus 204. Also, data storage and so forth is performed using a storage area in auxiliary storage apparatus 203, storage apparatus 204, or the like.

As described above, this semiconductor integrated circuit manufacturing method and manufacturing apparatus provide influences on characteristics due to parasitic elements and inter-element variation constituting problems after layout design as permissible ranges for parasitic elements and inter-element variation that satisfy circuit characteristics beforehand, decide element relative placement relationships, placement positions, and placement shapes so as to fit within these permissible ranges in the floor plan process, and also provided routing constraints to the routing process. By performing routing in accordance with these routing constraints, it is possible to implement a layout that satisfies characteristics in operational verification after layout design. Furthermore, element displacement and deformation are performed so as to eliminate empty areas within the layout area, enabling placement requiring minimal surface area to be implemented.

The processes that provide permissible ranges (such as the parasitic element extraction process, for example) described in Embodiments 2 through 9 may be part of a process within the permissible range extraction process, or may be a separate process as shown in FIG. 14 through FIG. 21.

As described above, according to the present invention an analog layout placement method can be provided that enables implementation of automatic placement that reflects constraints provided regarding parasitic elements and inter-element variation provided in a real-valued range.

Therefore, a semiconductor integrated circuit manufacturing apparatus and manufacturing method according to the present invention have a floor plan process that satisfies constraints with respect to parasitic elements and inter-element variation, and are particularly useful as an analog layout automated design method or analog layout automated design apparatus, or the like.

The present invention is not limited to the above-described embodiments, and various variations and modifications may be possible without departing from the scope of the present invention.

This application is based on Japanese Patent Application No. 2004-280517 filed on Sep. 27, 2004, the entire content of which is expressly incorporated by reference herein.

What is claimed is:

1. A semiconductor integrated circuit manufacturing method, including a netlist, said method comprising:
   setting a permissible range of values relating to an element, the setting being based on categorizing previously extracted floor plan data and searching the categorized data;
   creating a floor plan in accordance with the netlist, the floor plan satisfying the permissible range of values;
   placing a plurality of elements in a configuration on a basis of the floor plan;
   extracting routing constraints for the configuration to realize a permissible range of values for a plurality of parasitic elements; and
   routing a pattern in accordance with the extracted routing constraints,
   wherein setting the permissible range of values comprises:
   executing a provisional floor plan from circuit connection information;
   inserting only parasitic elements extracted from said provisional floor plan into relevant nodes of a circuit;
   deriving a range of parasitic element values satisfying characteristics from results of a circuit simulation in which parasitic element values are increased or decreased; and
   providing a derived range of parasitic element values as said permissible range of values for the plurality of parasitic elements.

2. The semiconductor integrated circuit manufacturing method according to claim 1, said setting the permissible range of values comprising setting at least one of a permissible range of values for a parasitic element and a permissible range of values for an inter-element variation.

3. The semiconductor integrated circuit manufacturing method according to claim 1, said creating a floor plan comprises determining a relative placement relationship for said element using said permissible range of values relating to said element.

4. The semiconductor integrated circuit manufacturing method according to claim 1, said creating a floor plan comprises placing said plurality of elements in a shape that fits within either a rectangular or polygonal layout area.

5. The semiconductor integrated circuit manufacturing method according to claim 1, said creating a floor plan comprises determining an element size and an element shape for said element from a process information in accordance with a set inter-element variation permissible range of values.

6. The semiconductor integrated circuit manufacturing method according to claim 1, said creating a floor plan comprises searching a range of values that maintains said element relative to a positionally relationship within a layout area of an element displacement range of values.

7. The semiconductor integrated circuit manufacturing method according to claim 1, said creating a floor plan comprises:
   adding together a wiring length estimated between said plurality of elements and a wiring length estimated in connection between identical nodes within one of said plurality of elements to establish virtual wiring; and
   calculating a virtual parasitic value from said virtual wiring.

8. The semiconductor integrated circuit manufacturing method according to claim 1, said creating a floor plan comprises calculating a virtual inter-element variation value from a distance between a plurality of barycenters of said plurality of elements.

9. The semiconductor integrated circuit manufacturing method according to claim 1, wherein a plurality of design rules are provided beforehand, said floor plan comprises reducing an empty area by displacing, dividing or deforming said element in accordance with at least one of the plurality of design rules.

10. The semiconductor integrated circuit manufacturing method according to claim 1, further comprising extracting routing constraints relating to a wiring length, a wiring width, a number of bends for each one of a plurality of wiring layers, a number of switchovers between the plurality of wiring layers, a contact shape and a number of contacts in a changeover, so that parasitic element values due to routing are within the permissible range of values.

11. The semiconductor integrated circuit manufacturing method according to claim 1, further comprising extracting routing constraints to bring into line a wiring length, a wiring width, and a number of bends for each one of a plurality of wiring layers, a number of switchovers between the plurality of wiring layers, a contact shape and a number of contacts in a changeover, so that parasitic element values due to routing are within the permissible range of values.

12. The semiconductor integrated circuit manufacturing method according to claim 1, further comprising extracting routing constraints that include at least one of an influence between a plurality of wiring layers, an influence between a plurality of identical wiring layers, and an influence with respect to a plurality of contacts.

13. The semiconductor integrated circuit manufacturing method according to claim 1, wherein said setting the permissible range of values comprises:
  extracting a plurality of parasitic element values from an existing layout data; and
  providing the plurality of extracted parasitic element values as a permissible range of values for a parasitic element.

14. The semiconductor integrated circuit manufacturing method according to claim 1, wherein said setting the permissible range of values comprises:
  inserting a parasitic element in a node of a circuit;
  deriving a range of parasitic element values satisfying characteristics from results of a circuit simulation in which parasitic element values are increased or decreased; and
  providing the derived range of parasitic element values as said permissible range of values for the plurality of parasitic elements.

15. The semiconductor integrated circuit manufacturing method according to claim 1, wherein process information is provided, said setting the permissible range of values comprises:
  extracting at least one distance between said plurality of elements from existing layout data and
  providing a plurality of variation values calculated from said process information and said at least one distance as a permissible range of values for inter-element variation.

16. The semiconductor integrated circuit manufacturing method according to claim 1, wherein said setting the permissible range of values comprises:
  deriving a range of inter-element variation values satisfying characteristics from results of a circuit simulation in which at least one of a circuit individual element size and an element parameter is increased or decreased and
  providing the range of inter-element variation values as a permissible range of values for inter-element variation.

17. The semiconductor integrated circuit manufacturing method according to claim 1, wherein process information is provided, said setting the permissible range of values comprises:
  executing a provisional floor plan from circuit connection information;
  extracting at least one distance between said plurality of elements from said provisional floor plan;
  calculating a plurality of variation values from said process information and said at least one distance;
  deriving a range of inter-element variation values satisfying characteristics from results of a circuit simulation in which plurality of variation values are increased or decreased and
  providing said range of inter-element variation values as a permissible range of values for inter-element variation.

18. The semiconductor integrated circuit manufacturing method according to claim 1, wherein said setting the permissible range of values comprises:
  recording a permissible range of values for the parasitic elements set by said permissible range setting step in a database, and providing values obtained by performing statistical processing on a recorded permissible range as a permissible range for parasitic elements.

19. The semiconductor integrated circuit manufacturing method according to claim 1, wherein said setting the permissible range of values comprises:
  recording a set permissible range of values for inter-element variation in a database; and
  providing a range of values obtained by performing statistical processing on the recorded permissible range of values.

20. A semiconductor integrated circuit manufacturing apparatus, comprising:
  a permissible range acquirer configured to acquire a permissible range of values relating to an element, the permissible range of values being acquired by categorizing previously extracted floor plan data and searching the categorized data;
  a floor plan section configured to create a floor plan that satisfies the permissible range of values;
  a placement section configured to place a plurality elements in a configuration on a basis of the floor plan and to extract routing constraints that realize a permissible range of values for parasitic elements; and
  a router configured to route a pattern in accordance with the extracted routing constraints,
  wherein said permissible range acquirer comprises:
  an executioner that executes a provisional floor plan from circuit connection information;
  an inserter that inserts only parasitic elements extracted from said provisional floor plan into relevant nodes of a circuit;
  a deriver that derives a range of parasitic element values satisfying characteristics from results of a circuit simulation in which parasitic element values are increased or decreased; and
  a provider that provides a derived range of parasitic element values as said permissible range of values for the plurality of parasitic elements.

* * * * *